(12) United States Patent
Nevers et al.

(10) Patent No.: US 9,923,088 B2
(45) Date of Patent: Mar. 20, 2018

(54) SEMICONDUCTOR DEVICE WITH VERTICALLY INTEGRATED PHEMTS

(71) Applicant: Qorvo US, Inc., Greensboro, NC (US)

(72) Inventors: Corey A. Nevers, Hillsboro, OR (US); Sheila K. Hurtt, Portland, OR (US); Dana A. Schwartz, Beaverton, OR (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/239,005

(22) Filed: Aug. 17, 2016

(65) Prior Publication Data

US 2018/0012986 A1    Jan. 11, 2018

Related U.S. Application Data

(60) Provisional application No. 62/359,843, filed on Jul. 8, 2016.

(51) Int. Cl.
| | |
|---|---|
| *H01L 29/66* | (2006.01) |
| *H01L 29/778* | (2006.01) |
| *H01L 29/06* | (2006.01) |
| *H01L 27/095* | (2006.01) |

(52) U.S. Cl.
CPC ........ *H01L 29/7786* (2013.01); *H01L 27/095* (2013.01); *H01L 29/0619* (2013.01); *H01L 29/0649* (2013.01)

(58) Field of Classification Search
CPC ............. H01L 29/7786; H01L 29/0619; H01L 29/0649
See application file for complete search history.

(56) References Cited

U.S. PATENT DOCUMENTS

| | | |
|---|---|---|
| 7,015,519 B2 | 3/2006 | Krutko et al. |
| 7,385,236 B2 | 6/2008 | Chin et al. |
| 7,718,486 B2 | 5/2010 | Krutko et al. |
| 8,994,069 B2 * | 3/2015 | Chin ................... H01L 29/7378 257/190 |

(Continued)

OTHER PUBLICATIONS

Henderson, T. et al., "High-Performance BiHEMT HBT / E-D pHEMT Integration," CS MANTECH Conference, May 14-17, 2007, Austin, Texas, USA, pp. 247-250.

(Continued)

*Primary Examiner* — Dale E Page
*Assistant Examiner* — Wasiul Haider
(74) *Attorney, Agent, or Firm* — Withrow & Terranova, P.L.L.C.

(57) ABSTRACT

The present disclosure relates to a semiconductor device with vertically integrated pseudomorphic high electron mobility transistors (pHEMTs). The disclosed semiconductor device includes a substrate, a lower pHEMT structure with a lower pHEMT, an isolation layer, and an upper pHEMT structure with an upper pHEMT. The lower pHEMT structure is formed over the substrate and has a first region and a second region that is laterally disposed with the first region. The lower pHEMT is formed in or on the second region. The isolation layer resides over the first region. The upper pHEMT structure is formed over the isolation layer and does not extend over the second region. Herein, the isolation layer separates the lower pHEMT structure from the upper pHEMT structure such that the lower pHEMT and the upper pHEMT operate independently from each other.

28 Claims, 2 Drawing Sheets

(56) References Cited

U.S. PATENT DOCUMENTS

Figure 1:
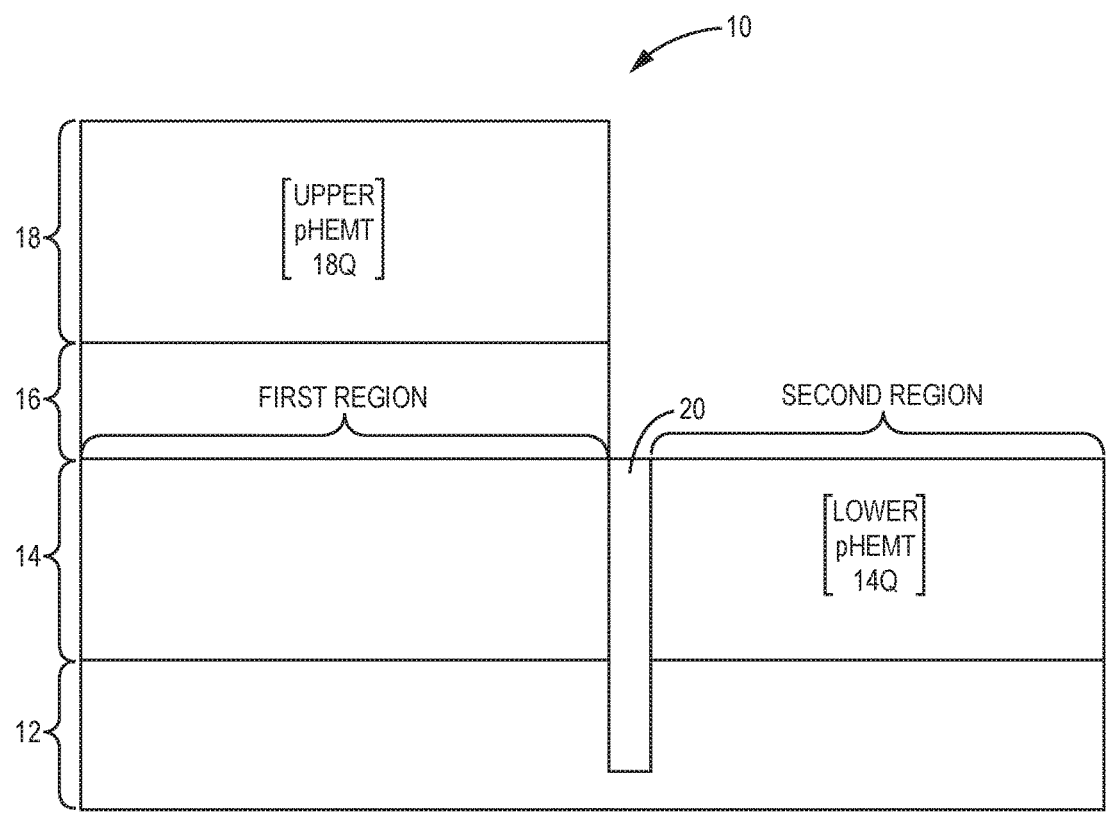

| | | | |
|---|---|---|---|
| 2006/0073674 A1* | 4/2006 | Fitzgerald | C30B 25/20 438/458 |
| 2006/0208279 A1* | 9/2006 | Robinson | H01L 29/7785 257/194 |
| 2012/0112243 A1 | 5/2012 | Zampardi et al. | |
| 2012/0126291 A1* | 5/2012 | Mitsunaga | H01L 27/0605 257/195 |
| 2013/0056794 A1* | 3/2013 | Nishikawa | H01L 29/812 257/190 |
| 2014/0332849 A1* | 11/2014 | Jang | H01L 29/7783 257/190 |
| 2015/0041820 A1* | 2/2015 | Renaud | H01L 29/778 257/76 |
| 2015/0256155 A1* | 9/2015 | Haeberlen | H03K 3/012 327/109 |

OTHER PUBLICATIONS

Jha, S.K. et al., 'Low-frequency noise properties of double channel AlGaN/GaN HEMTs: Solid-State Electronics, vol. 52, No. 5, May 2008, pp. 606-611.

Lin, Dong-Ming et al., "Dual-Gate E/E-and E/D-Mode AlGaAs/InGaAs pHEMTs for Microwave Circuit Applications," IEEE Transactions on Electron Devices vol. 54, No. 8, Aug. 2007, pp. 1818-1824.

Shokrani, Mohsen et al., "InGaP-Plus™: A Low Cost Manufacturable GaAs BiFET Process Technology," CS MANTECH Conference, Apr. 24-27, 2006, Vancouver, British Columbia, Canada, pp. 153-156.

\* cited by examiner

SEMICONDUCTOR DEVICE WITH VERTICALLY INTEGRATED PHEMTS

RELATED APPLICATIONS

This application claims the benefit of provisional patent application Ser. No. 62/359,843, filed Jul. 8, 2016, the disclosure of which is hereby incorporated herein by reference in its entirety.

FIELD OF THE DISCLOSURE

The present disclosure relates to a semiconductor device and more particularly to a semiconductor device with vertically integrated pseudomorphic high electron mobility transistors (pHEMTs).

BACKGROUND

With the current popularity of portable communication devices and developed semiconductor technologies, high level integration is becoming a trend in semiconductor fabrications. By integrating different transistors into a single semiconductor device within one fabrication process, the final package size and cost will be reduced. In different applications, these integrated transistors may implement different functions. Isolation of these integrated transistors is desired for different functions.

Pseudomorphic high electron mobility transistors (pHEMTs), due to their high gain up to millimeter-wavelengths and their enhanced noise and power performance, are widely used in high speed communication devices. To implement different functions with optimal performance, the pHEMTs may operate in different modes. For instance, the pHEMTs may operate in an enhancement mode to optimize low noise amplifier (LNA) performance, or the pHEMTs may operate in a depletion mode for high-speed switch implementations. However, a conventional pHEMT structure has a single channel that both the enhancement mode and the depletion mode share. Consequently, it is rarely possible to optimize the performance of both the enhancement mode and the depletion mode independently.

Accordingly, there remains a need for improved semiconductor device designs to utilize the advantages of pHEMTs while optimizing the performance of both the enhancement mode and the depletion mode independently. In addition, there is also a need to keep the size and cost of the final products effective.

SUMMARY

The present disclosure relates to a semiconductor device with vertically integrated pseudomorphic high electron mobility transistors (pHEMTs). The disclosed semiconductor device includes a substrate, a lower pHEMT structure with a lower pHEMT, an isolation layer, and an upper pHEMT structure with an upper pHEMT. The lower pHEMT structure is formed over the substrate and has a first region and a second region that is laterally disposed with the first region. The lower pHEMT is formed in or on the second region. The isolation layer resides over the first region. The upper pHEMT structure is formed over the isolation layer and does not extend over the second region. The upper pHEMT is formed in or on the upper pHEMT structure. Herein, the isolation layer separates the lower pHEMT structure from the upper pHEMT structure such that the lower pHEMT and the upper pHEMT operate independently from each other.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 provides an exemplary semiconductor device with vertically integrated pseudomorphic high electron mobility transistors according to one embodiment of the present disclosure.

Figure 2:
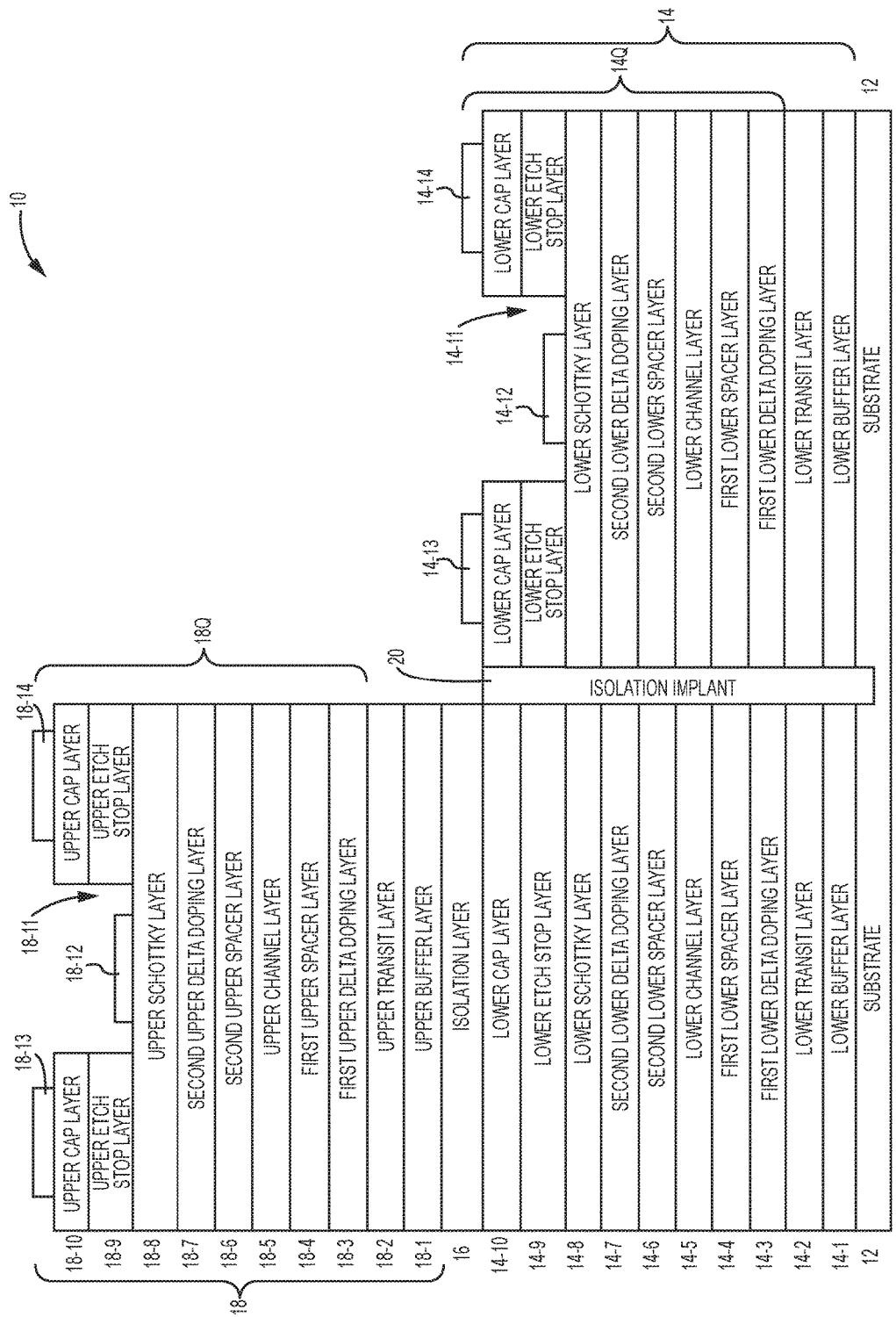

FIG. 2 provides a detailed structure of the exemplary semiconductor device shown in FIG. 1.

It will be understood that for clear illustrations, FIGS. 1-2 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 provides an exemplary semiconductor device 10 with vertically integrated pseudomorphic high electron mobility transistors (pHEMTs) according to one embodiment of the present disclosure. The exemplary semiconductor device 10 includes a substrate 12, a lower pHEMT structure 14 with a lower pHEMT 14Q, an isolation layer 16, and an upper pHEMT structure 18 with an upper pHEMT 18Q. The lower pHEMT structure 14 is formed over the substrate 12 and has a first region and a second region that is laterally disposed with the first region. The lower pHEMT 14Q is formed in or on the second region. The isolation layer 16 resides over the first region. The upper pHEMT structure 18 is formed over the isolation layer 16 and does not extend over the second region. The upper pHEMT 18Q is formed in or on the upper pHEMT structure 18. The isolation layer 16 separates the lower pHEMT structure 14 from the upper pHEMT structure 18 such that the lower pHEMT 14Q and the upper pHEMT 18Q operate independently from each other. Herein, separating the lower pHEMT structure 14 from the upper pHEMT structure 18 refers to an equivalent or less back gating effect or side gating effect than two side-by-side FETs with the same lateral spacing at least at the frequency between direct current (DC) and 100 GHz. Further, an isolation implant 20 may be included in the semiconductor device 10, which is formed through the lower pHEMT structure 14 and extends into the substrate 12.

In detail, the substrate 12 may be formed of gallium arsenide (GaAs) or indium phosphide (InP). The semiconductor materials used for the lower pHEMT structure 14 and the upper pHEMT structure 18 may be selected so as to lattice match to the substrate 12. Because of the separation between the lower pHEMT structure 14 and the upper pHEMT structure 18, the lower pHEMT structure 14 is allowed to have a different size from the upper pHEMT structure 18 in order to keep the final size of the semiconductor device 10 effective. For instance, the lower pHEMT 14Q may be dedicated to low current for supporting circuit elements, which requires a larger lower pHEMT structure 14; while the upper pHEMT structure 18 may remain small for high frequency applications. In addition, the lower pHEMT 14Q and the upper pHEMT 18Q may operate in different modes independently. The lower pHEMT 14Q may operate in either the enhancement mode or the depletion mode due to different applications. Similarly, the upper pHEMT 18Q may operate in either the enhancement mode or the depletion mode. For instance, the lower pHEMT 14Q may operate in the enhancement mode to optimize a low noise amplifier (LNA) performance, while the upper pHEMT 18Q may operate in the depletion mode to optimize a high-speed switch performance. Alternatively, the lower pHEMT 14Q may operate in the depletion mode to optimize a current source/logic performance, while the upper pHEMT 18Q may operate in the enhancement mode to optimize a power amplifier (PA) performance. Further, both the lower pHEMT 14Q and the upper pHEMT 18Q may operate in the enhancement mode or in the depletion mode. The semiconductor device 10, with this vertically integrated structure, may allow for easy decoupling of the two pHEMTs from each other, such that both the lower pHEMT 14Q and the upper pHEMT 18Q may optimize performance.

In this embodiment, the isolation layer 16 resides over the first region of the lower pHEMT structure 14 and does not extend over any portion of the second region of the lower pHEMT structure 14. The isolation layer 16 may be formed of aluminum gallium arsenide ($Al_xGa_{1-x}As$), indium gallium phosphide ($In_yGa_{1-y}P$), or aluminum indium gallium phosphide ($Al_xIn_yGa_{1-x-y}P$). Herein, 'x' has a value between 0 and 1 representing relative quantities of respective elements, 'y' has a value between 0.4 and 0.6 representing relative quantities of respective elements, and "1−x−y" has a non-negative value. The isolation layer 16 may be doped with at least one p-type dopant, such as carbon(C), zinc (Zn), magnesium (Mg), and beryllium (Be), at a doping concentration between $1E17/cm^3$ and $1E20/cm^3$. The isolation layer 16 has a thickness between 50 Å and 5000 Å.

In addition, the isolation implant 20 may be formed through the lower pHEMT structure 14 and extends down to the substrate 12. The isolation implant 20 separates the first region of the lower pHEMT structure 14 from the second region of the lower pHEMT structure 14, such that the isolation implant 20 provides electrical isolation to the lower pHEMT 14Q from other devices (not shown) formed on the substrate 12. The isolation implant 20 may be an aluminum (Al) or helium (He) ion implant at a dose between $1E12/cm^2$ and $5E13/cm^2$. The isolation implant 20 has a depth of at least 0.5 μm.

FIG. 2 provides a detailed structure of the exemplary semiconductor device 10 shown in FIG. 1. The lower pHEMT structure 14 and the upper pHEMT structure 18 have similar layer structures. The lower pHEMT structure 14 includes a lower buffer layer 14-1, a lower transit layer 14-2, a first lower delta doping layer 14-3, a first lower spacer layer 14-4, a lower channel layer 14-5, a second lower spacer layer 14-6, a second lower delta doping layer 14-7, a lower Schottky layer 14-8, an optional lower etch stop layer 14-9, and a lower cap layer 14-10. Each of these layers extends through both the first and the second regions of the lower pHEMT structure 14.

The lower buffer layer 14-1 is formed over the substrate 12 and at a bottom portion of the lower pHEMT structure 14. The lower buffer layer 14-1 may be formed of at least one of undoped GaAs or undoped aluminum gallium arsenide (AlGaAs) with a thickness between 50 Å and 1 μm. In some applications, the lower buffer layer 14-1 includes a first lower buffer layer (not shown) formed of undoped AlGaAs and a second lower buffer layer (not shown) formed of undoped GaAs. The first lower buffer layer is formed over the substrate 12 and the second lower buffer layer is formed over the first lower buffer layer. The lower transit layer 14-2 over the lower buffer layer 14-1 may be formed of undoped AlGaAs, where a percentage of aluminum in the undoped AlGaAs of the lower transit layer 14-2 may be between 18% and 26%.

The lower pHEMT 14Q is formed from the first lower delta doping layer 14-3, the first lower spacer layer 14-4, the lower channel layer 14-5, the second lower spacer layer 14-6, the second lower delta doping layer 14-7, the lower Schottky layer 14-8, the optional lower etch stop layer 14-9, and the lower cap layer 14-10. The first lower delta doping layer 14-3 and the first lower spacer layer 14-4 are formed over the lower transit layer 14-2. The first lower delta doping layer 14-3 may be doped with silicon (Si), sulfur (S), tellurium (Te), germanium (Ge), or selenium (Se). A uniform doping method may be used to dope the first lower delta doping layer 14-3 with a doping concentration between $1E17/cm^3$ to $5E18/cm^3$. A delta or planar doping method may also be used to dope the first lower delta doping layer 14-3 with a doping concentration between $5E11/cm^2$ to $4E12/cm^2$. The first lower spacer layer 14-4 may be formed of undoped AlGaAs.

On top of the first lower spacer layer 14-4, the lower channel layer 14-5 may be formed of undoped indium gallium arsenide (InGaAs) with a thickness between 40 Å and 150 Å. A percentage of indium in the undoped InGaAs of the lower channel layer 14-5 may be between 15% and 50%. The second lower spacer layer 14-6 and the second lower delta doping layer 14-7 are formed over the lower channel layer 14-5. The second lower spacer layer 14-6 may be formed of undoped AlGaAs and the second lower delta doping layer 14-7 may be doped with Si, S, Te, Ge, or Se. A uniform doping method may be used to dope the second lower delta doping layer 14-7 with a doping concentration between $1E17/cm^3$ to $5E18/cm^3$. A delta or planar doping method may also be used to dope the second lower delta doping layer 14-7 with a doping concentration between $5E11/cm^2$ to $4E12/cm^2$.

In addition, the lower Schottky layer 14-8 is formed over the second lower delta doping layer 14-7 with a thickness between 50 Å and 400 Å. The lower Schottky layer 14-8 may include at least one of GaAs, AlGaAs, indium gallium phosphide (InGaP), aluminum indium phosphide (AlInP), aluminum indium gallium phosphide (AlInGaP), and aluminum arsenide (AlAs). AlGaAs, InGaP, AlInP, AlInGaP, and AlAs are high bandgap materials having higher bandgaps than GaAs and also provide good etch selectivity with GaAs under either wet or dry etch conditions. These high bandgap materials are nominally lattice matched to the substrate 12. If the lower Schottky layer 14-8 includes AlGaAs, a percentage of aluminum in the AlGaAs of the lower Schottky layer 14-8 may be between 18% and 26%. The lower Schottky layer 14-8 may be doped with Si, S, Te, Ge, or Se. A doping concentration used in the lower Schottky layer 14-8 may be between undoped to $5E17/cm^3$.

The optional lower etch stop layer 14-9 is formed over the lower Schottky layer 14-8 and may be formed of AlGaAs or InGaP at a doping concentration about $1E17/cm^3$. The lower cap layer 14-10 is sandwiched between the optional lower etch stop layer 14-9 and the isolation layer 16. The lower cap layer 14-10 may be formed of GaAs at an adjustable doping concentration between $1E18/cm^3$ and $1.4E19/cm^3$ (more details in the following discussion).

The lower pHEMT 14Q also includes a lower cavity 14-11 formed in the optional lower etch stop layer 14-9 and the lower cap layer 14-10. A portion of the lower Schottky layer 14-8 is exposed to the lower cavity 14-11 in the second region of the lower pHEMT structure 14. A lower gate contact 14-12 is positioned within the lower cavity 14-11 and in contact with the lower Schottky layer 14-8. In addition, a lower source contact 14-13 and a lower drain contact 14-14 are formed over different portions of the lower cap layer 14-10, which are separated by the lower cavity 14-11 and formed in or on the second region of the lower pHEMT structure 14. The lower gate contact 14-12, the lower source contact 14-13, and the lower drain contact 14-14 may be formed of conductive metals as rectifying or ohmic contacts.

Similarly, the upper pHEMT structure 18 includes an upper buffer layer 18-1, an upper transit layer 18-2, a first upper delta doping layer 18-3, a first upper spacer layer 18-4, an upper channel layer 18-5, a second upper spacer layer 18-6, a second upper delta doping layer 18-7, an upper Schottky layer 18-8, an optional upper etch stop layer 18-9, and an upper cap layer 18-10. In this embodiment, each of these layers resides over the isolation layer 16 and does not extend over the second region of the lower pHEMT structure 14.

The upper buffer layer 18-1 is formed over the isolation layer 16 and at a bottom portion of the upper pHEMT structure 18. The upper buffer layer 18-1 may be formed of at least one of undoped GaAs or undoped AlGaAs with a thickness between 50 Å and 1 μm. The upper transit layer 18-2 over the upper buffer layer 18-1 may be formed of undoped AlGaAs, where a percentage of aluminum in the undoped AlGaAs of the upper transit layer 18-2 may be between 18% and 26%.

The upper pHEMT 18Q is formed from the first upper delta doping layer 18-3, the first upper spacer layer 18-4, the upper channel layer 18-5, the second upper spacer layer 18-6, the second upper delta doping layer 18-7, the upper Schottky layer 18-8, the optional upper etch stop layer 18-9, and the upper cap layer 18-10. The first upper delta doping layer 18-3 and the first upper spacer layer 18-4 are formed over the upper transit layer 18-2. The first upper delta doping layer 18-3 may be doped with Si, S, Te, Ge, or Se. A uniform doping method may be used to dope the first upper delta doping layer 18-3 with a doping concentration between $1E17/cm^3$ to $5E18/cm^3$. A delta or planar doping method may also be used to dope the first upper delta doping layer 18-3 with a doping concentration between $5E11/cm^2$ to $4E12/cm^2$. The first upper spacer layer 18-4 may be formed of undoped AlGaAs. Herein, the first upper delta doping layer 18-3 and the second lower delta doping layer 14-7 are heavily doped, thus the upper buffer layer 18-1, the isolation layer 16, and the lower cap layer 14-10 in between will generate a buffer capacitance between 1 fF and 250 fF, which is critical to device performances. Any layer parameter of the lower cap layer 14-10 (such as a doping concentration and a thickness) and any layer parameter of the isolation layer 16 (such as a doping concentration, a thickness, and dopant type) may be adjusted to optimize the buffer capacitance for different applications. Devices, like power amplifiers, that are sensitive to the buffer capacitance, may be placed in the lower pHEMT structure 14.

On top of the first upper spacer layer 18-4, the upper channel layer 18-5 may be formed of undoped InGaAs with a thickness between 40 Å and 150 Å. A percentage of indium in the undoped InGaAs of the upper channel layer 18-5 may be between 15% and 50 %. The upper channel layer 18-5 is formed from a different layer other than the lower channel layer 14-5, and the upper channel layer 18-5 is independent from the lower channel layer 14-5. The second upper spacer layer 18-6 and the second upper delta doping layer 18-7 are formed over the upper channel layer 18-5. The second upper spacer layer 18-6 may be formed of undoped AlGaAs and the second upper delta doping layer 18-7 may be doped with Si, S, Te, Ge, or Se. A uniform doping method may be used to dope the second upper delta doping layer 18-7 with a doping concentration between $1E17/cm^3$ to $5E18/cm^3$. A delta or planar doping method may also be used to dope the second upper delta doping layer 18-7 with a doping concentration between $5E11/cm^2$ to $4E12/cm^2$.

In addition, the upper Schottky layer 18-8 is formed over the second upper delta doping layer 18-7 with a thickness between 50 Å and 400 Å. The upper Schottky layer 18-8 may include at least one of GaAs, AlGaAs, InGaP, AlInP, AlInGaP, and AlAs. AlGaAs, InGaP, AlInP, AlInGaP, and AlAs are high bandgap materials having higher bandgaps than GaAs and also provide good etch selectivity with GaAs under either wet or dry etch conditions. These high bandgap materials are nominally lattice matched to the substrate 12. If the upper Schottky layer 18-8 includes AlGaAs, a percentage of aluminum in the AlGaAs of the upper Schottky layer 18-8 may be 18% and 26%. The upper Schottky layer 18-8 may be doped with Si, S, Te, Ge, or Se. A doping concentration used in the upper Schottky layer 18-8 may be between undoped and $5E17/cm^3$. Herein, the upper Schottky layer 18-8 is formed from a different layer other than the lower Schottky layer 14-8, and the upper Schottky layer 18-8 is independent from the lower Schottky layer 14-8.

The optional upper etch stop layer 18-9 and the upper cap layer 18-10 are formed over the upper Schottky layer 18-8. The upper etch stop layer 18-9 may be formed of AlGaAs or InGaP, and the upper cap layer 18-10 may be formed of GaAs. The upper pHEMT 18Q also includes an upper cavity 18-11 formed in the optional upper etch stop layer 18-9 and the upper cap layer 18-10. A portion of the upper Schottky layer 18-8 is exposed to the upper cavity 18-11. An upper gate contact 18-12 is positioned within the upper cavity 18-11 and in contact with the upper Schottky layer 18-8. In addition, an upper source contact 18-13 and an upper drain contact 18-14 are formed over different portions of the upper cap layer 18-10, which are separated by the upper cavity 18-11 and formed in or on the upper pHEMT structure 18. The upper gate contact 18-12, the upper source contact 18-13, and the upper drain contact 18-14 may be formed of conductive metals as rectifying or ohmic contacts.

Notice that the lower pHEMT 14Q and the upper pHEMT 18Q have separate channel layers and Schottky layers. The lower channel layer 14-5 is independent from the upper channel layer 18-5, and the lower Schottky layer 14-8 is independent from the upper Schottky layer 18-8. The separation allows the lower channel layer 14-5 to have a different percentage of indium in the undoped InGaAs from the upper channel layer 18-5, such as a higher percentage of indium in the lower channel layer 14-5 for a superior switch performance and a lower percentage of indium in the upper channel layer 18-5 for a superior amplifier transconductance. Also, the separation allows the lower channel layer 14-5 to have a different thickness from the upper channel layer 18-5. Further, the separation allows the lower Schottky layer 14-8 to be formed of different materials with different thicknesses from the upper Schottky layer 18-8. The lower Schottky layer 14-8 may include high band gap materials (AlGaAs, InGaP, AlInP, AlInGaP, or AlAs) when the lower pHEMT 14Q is designed to operate in an enhancement mode; while the upper Schottky layer 18-8 may not include high band gap materials when the upper pHEMT 18Q is designed to operate in a depletion mode. Consequently, the separation optimizes the performance of both vertically integrated pHEMTs as independently as possible.

A fabrication processing of the lower pHEMT structure 14 and the upper pHEMT structure 18 may be completely separate to minimize integration effects or may be combined to reduce the number of steps.

Those skilled in the art will recognize improvements and modifications to the preferred embodiments of the present disclosure. All such improvements and modifications are considered within the scope of the concepts disclosed herein and the claims that follow.

What is claimed is:
1. An apparatus comprising:
   a substrate;
   a lower pseudomorphic high electron mobility transistor (pHEMT) structure formed over the substrate and having a first region and a second region that is laterally disposed with the first region, wherein:
      the lower pHEMT structure comprises a lower doping layer doped with at least one n-type dopant; and
      a lower pHEMT is formed in or on the second region;
   an isolation layer residing over the first region; and
   an upper pHEMT structure formed over the isolation layer and not extending over the second region, wherein:
      the upper pHEMT structure comprises an upper doping layer doped with at least one n-type dopant;
      an upper pHEMT is formed in or on the upper pHEMT structure; and
      the isolation layer separates the lower pHEMT structure from the upper pHEMT structure such that the lower pHEMT and the upper pHEMT operate independently from each other.

2. The apparatus of claim 1 wherein the isolation layer does not extend over the second region.

3. The apparatus of claim 1 wherein the isolation layer is formed of aluminum gallium arsenide ($Al_xGa_{1-x}As$), wherein x has a value between 0 and 1 representing relative quantities of respective elements.

4. The apparatus of claim 1 wherein the isolation layer is formed of Indium gallium phosphide ($In_yGa_{1-y}P$), wherein y has a value between 0.4 and 0.6 representing relative quantities of respective elements.

5. The apparatus of claim 1 wherein the isolation layer is formed of aluminum indium gallium phosphide ($Al_xIn_yGa_{1-y-x}P$), wherein:
   x, y, and 1−x−y represent relative quantities of respective elements; and
   x has a value between 0 and 1, y has a value between 0.4 and 0.6, and 1−x−y has a non-negative value.

6. The apparatus of claim 1 wherein the isolation layer is doped with at least one p-type dopant at a doping concentration between $1E17/cm^3$ and $1E20/cm^3$.

7. The apparatus of claim 6 wherein at least one p-type dopant comprises one of a group consisting of carbon(C), zinc (Zn), magnesium (Mg), and beryllium (Be).

8. The apparatus of claim 1 wherein the isolation layer has a thickness between 50 Å and 5000 Å.

9. The apparatus of claim 1 wherein the upper pHEMT is one of a depletion mode transistor and an enhancement mode transistor, and the lower pHEMT is one of the depletion mode transistor and the enhancement mode transistor.

10. The apparatus of claim 9 wherein the lower pHEMT comprises a lower channel layer and the upper pHEMT comprises an upper channel layer, wherein the lower channel layer is formed from a different layer other than the upper channel layer, and the lower channel layer is independent from the upper channel layer.

11. The apparatus of claim 10 wherein the lower pHEMT further comprises a lower Schottky layer and the upper pHEMT further comprises an upper Schottky layer, wherein the lower Schottky layer is formed from a different layer other than the upper Schottky layer, and the lower Schottky layer is independent from the upper Schottky layer.

12. The apparatus of claim 1 wherein the lower pHEMT comprises a lower channel layer and the upper pHEMT comprises an upper channel layer, wherein the lower channel layer is formed from a different layer other than the upper channel layer, and the lower channel layer is independent from the upper channel layer.

13. The apparatus of claim 12 wherein the lower pHEMT further comprises a lower Schottky layer and the upper pHEMT further comprises an upper Schottky layer, wherein the lower Schottky layer is formed from a different layer other than the upper Schottky layer, and the lower Schottky layer is independent from the upper Schottky layer.

14. The apparatus of claim 12 wherein the lower channel layer extends through both the first region and the second region.

15. The apparatus of claim 12 wherein the lower pHEMT further comprises a lower cap layer, which is formed at a top portion of the lower pHEMT structure and below the isolation layer, wherein the isolation layer and the lower cap layer are used to optimize a capacitance generated between the lower channel layer and the upper channel layer.

16. The apparatus of claim 12 wherein the lower channel layer and the upper channel layer are formed from undoped indium gallium arsenide (InGaAs).

17. The apparatus of claim 1 wherein the lower pHEMT comprises a lower Schottky layer and the upper pHEMT further comprises an upper Schottky layer, wherein the lower Schottky layer is formed from a different layer other than the upper Schottky layer, and the lower Schottky layer is independent from the upper Schottky layer.

18. The apparatus of claim 17 wherein the lower Schottky layer extends through both the first region and the second region.

19. The apparatus of claim 18 wherein the lower Schottky layer comprises at least one of a group consisting of gallium arsenide (GaAs), AlGaAs, InGaP, aluminum indium phosphide (AlInP), aluminum indium gallium phosphide (AlInGaP), and aluminum gallium (AlAs), and the upper Schottky layer comprises at least one of a group consisting of GaAs, AlGaAs, InGaP, AlInP, AlInGaP, and AlAs.

20. The apparatus of claim 18 wherein the lower Schottky layer comprises AlGaAs, wherein a percentage of aluminum in the AlGaAs is between 18% and 26%.

21. The apparatus of claim 18 wherein the upper Schottky layer comprises AlGaAs, wherein a percentage of aluminum in the AlGaAs is between 18% and 26%.

22. The apparatus of claim 1 wherein the lower pHEMT structure comprises a lower buffer layer, which is formed over the substrate and at a bottom portion of the lower pHEMT structure, and the upper pHEMT structure comprises an upper buffer layer, which is formed over the isolation layer and at a bottom portion of the upper pHEMT structure.

23. The apparatus of claim 22 wherein the lower buffer layer is formed of at least one of undoped gallium arsenide (GaAs) and undoped AlGaAs, and the upper buffer layer is formed of at least one of undoped gallium arsenide (GaAs) and undoped AlGaAs.

24. The apparatus of claim 1 further comprising an isolation implant that extends through the lower pHEMT structure and extends into the substrate such that the isolation implant separates the first region and the second region.

25. The apparatus of claim 24 wherein the isolation implant is formed from aluminum (Al) or helium (He) ions at a dose between $1E12/cm^2$ and $5E13/cm^2$.

26. The apparatus of claim 1 wherein the isolation layer is doped with C at a doping concentration between $1E17/cm^3$ and $1E20/cm^3$.

27. The apparatus of claim 26 wherein the isolation layer is directly between an undoped buffer layer of the upper pHEMT structure and a doped cap layer of the lower pHEMT structure.

28. The apparatus of claim 1 wherein the lower doping layer of the lower pHEMT structure is a lower delta doping layer, and the upper doping layer of the upper pHEMT structure is an upper delta doping layer.

* * * * *